United States Patent [19]
Zyss et al.

[11] Patent Number: 5,374,734
[45] Date of Patent: Dec. 20, 1994

[54] MONOHYDROGENTARTRATE CRYSTALLINE STRUCTURE HAVING NONLINEAR QUADRATIC EFFECTS

[75] Inventors: Joseph Zyss, Sceaux; Roland Hierle, Paris; René Masse, Brignoud; Jean-Pierre Levy, Grenoble, France

[73] Assignees: France Telecom; Centre National de la Recherche Scientifique (CNRS), both of Paris, France

[21] Appl. No.: 51,398

[22] Filed: Apr. 23, 1993

[30] Foreign Application Priority Data

Apr. 24, 1992 [FR] France ................... 92 05077

[51] Int. Cl.$^5$ ............................................ C07D 213/90
[52] U.S. Cl. ............................................ 546/347
[58] Field of Search ................................. 546/347

[56] References Cited

PUBLICATIONS

Schnekenburger et al., Arch. Pharm., 316(1), pp. 27–33, 1983.
J. Opt. Soc. Am.B/vol. 4, No. 6/ Jun. 1987, pp. 998–1012.
Nonlinear Optical Properties, pp. 27–56, 1983.
J. Chem. Phys. 74(9), May 1, 1981, pp. 4800–4811.
J. Chem. Phys. 81(9), Nov. 1, 1984, pp. 4160–4167.
Molecular Engineering 1: 141–152, 1991.
J. Chem. Phys. 75(3), Aug. 1, 1981, pp. 1509–1516.
Chemical Physics, 150, 125–135, 1991.
Acta Cryst. (1966) 21, 237.
Appl. Cryst. (1979), 12, 537–544.

*Primary Examiner*—C. Warren Ivy
*Assistant Examiner*—Zinna N. Davis
*Attorney, Agent, or Firm*—Jacobson, Price, Holman & Stern

[57] ABSTRACT

The present invention relates to new left-handed or right-handed monohydrogentartrate crystalline structures having nonlinear quadratic effects and a wide transparency range extending from the visible to the near infrared, consisting of optionally substituted 2-amino-5-nitropyridinium cations in combination with a polyanionic organic matrix formed of left-handed or right-handed monohydrogentartrate anions.

It also relates to a process for the preparation of these crystalline structures consisting in mixing one mole of cation base with at least two moles of left-handed and-/or right-handed tartaric acid. It finally relates to a device having an electrooptical effect containing said crystalline structure.

2 Claims, 2 Drawing Sheets

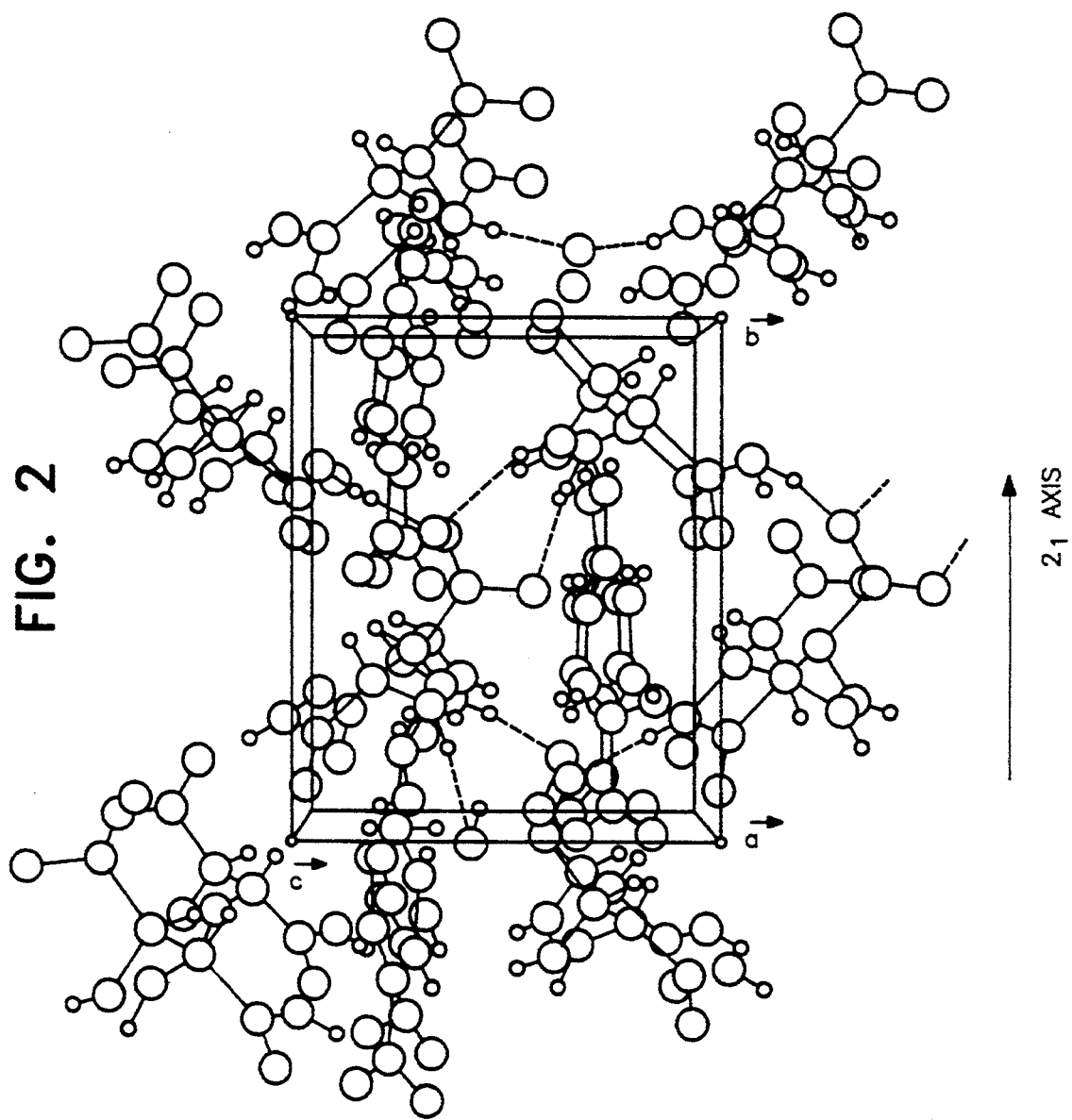

MONOHYDROGENTARTRATE CRYSTALLINE STRUCTURE HAVING NONLINEAR QUADRATIC EFFECTS

The present invention relates to new crystalline structures having nonlinear quadratic effects and a wide transparency range extending from the visible to the near infrared. It also relates to a process for the preparation of these crystalline structures and a device having an electrooptical effect containing such a crystalline structure.

The noncentrosymmetric structure of the crystal confers a nonlinear quadratic $x^{(2)}$ susceptibility tensor on it which can be used in any configuration of the mixture containing three waves of "all optical" (second-harmonic generation, frequency conversion, parametric effects) and electrooptical (Pockel's effect) type. The highest nonlinear coefficient is directed along the molecular dipoles which are parallel to each other in the crystalline network.

Research into crystalline structures having nonlinear quadratic effects which are increased with respect to materials such as potassium dihydrogenphosphate (Okada et al., Jap. J. Appl. Phys., 16, 55, 1977) and a wide transparency range extending from the visible to the near infrared has been directed during the last ten years towards organic molecules such as have been listed, for example, in the book edited by D. S. Chemla and J. Zyss, Academic Press (1987), "Nonlinear Optical Properties of Organic Molecules and Crystals". Among the crystalline structures of this type, there may be mentioned:

POM (3-methyl-4-nitropyridine 1-oxide) (J. Zyss, D. S. Chemla and J. F. Nicoud, J. Chem. Phys., 74, 4800, (1981)), NPP (N-(4-nitrophenyl)-L-prolinol) (J. Zyss, J. F. Nicoud and A. Coquillay, J. Chem. Phys., 81, 4160 (1984)), NPAN (N-(4-nitrophenyl)-N-(dimethylamino)acetonitrile (P. Vidakovic, M. Coquillay and A. Salin, J. Opt. Soc. Am., B4, 998, (1987).

These crystals have an exceptionally high nonlinearity (for example $d_{21}$ of the order of 50 pm/V for NPP) at the cost, however, of a restricted transparency towards the blue part of the spectrum. Moreover, the cohesion and the stability to air of such crystals under usual application conditions can, for some of them, have disadvantages: this is in particular the case for POM which must be immersed in a protective liquid and has, moreover, a marked tendency to sublime.

It has recently been proposed by R. Masse and J. Zyss, in Molecular Engineering, 1, 141, 1991, to encapsulate nonlinear organic molecules in a "framework" network consisting of inorganic anions combined with each other via hydrogen bonds. The organic entity is designed so as to be grafted, via single or multiple hydrogen bonds, to the inorganic anions. The proposed polyanions are of arseniate $(H_2AsO_4^-)_n$, sulfate $(HSO_4^-)_n$ or phosphate $(H_2PO_4^-)_n$ type. A particularly advantageous crystal has been identified in this family: 2-amino-5-nitropyridinium dihydrogenmonophosphate (2A5NPDP).

This crystalline structure, of mm2 point symmetry, has an inclination of the order of 36° of the transition dipoles of the organic entity with respect to the crystalline polar axis, which promotes the coefficient $d_{31}$ (of the order of 10 pm/V) and the parametric effects demanding phase harmony by birefringence (second-harmonic generation, parametric amplification).

It is nevertheless desirable to find other crystalline structures where a coefficient $d_{ii}$ (with i=1, 2 or 3) would preferably be optimized by the most perfect possible alignment of the molecules in the network along a crystallographic direction i in the image of the MNA (2-methyl-4-nitroaniline) crystals as they have been described by G. Lipscomb, A. Garito and R. Narang, J. Chem. Phys., 75, 1509, (1981) or of the DMACB (4,4'-dimethylaminocyanobiphenyl) crystals as they have been described by J. Zyss, I. Ledoux, M. Bertault and E. Toupet, Chem. Phys., 150, 125, (1991).

It is recalled that the coefficients $d_{21}$ and $d_{22}$ refer to the nonlinear quadratic susceptibility tensor coefficients, the axis 2 being the axis of linear symmetry in the crystallographic group 2 (in contrast with rotation).

Moreover, it is pointed out that G. R. Meredith (ACS Symposium Series, 233, 27–56 (1983)) has developed organic salts for nonlinear quadratic optics, in which cations, having an intramolecular charge transfer nature, are combined with inorganic or chiral or achiral organic anions. The anions used in this reference are independent units which are not arranged in a polyanionic structure and the mechanical cohesion of such structures is still not sufficient.

In view of the prior art explained above, one of the subjects of the invention is to propose new crystalline structures having nonlinear quadratic effects.

A second subject of the invention is to propose crystalline structures having nonlinear quadratic effects which are increased with respect to those of the prior art.

Another subject of the present invention is to propose crystalline structures having nonlinear quadratic effects and an excellent cohesion of the organic molecular entities in the crystal.

Other subjects of the invention will become apparent on reading the description which will follow.

According to the present invention, the crystalline structure having nonlinear quadratic effects and a wide transparency range extending from the visible to the near infrared consists of optionally substituted 2-amino-5-nitropyridinium cations combined with a poly-anionic organic matrix formed of left-handed or right-handed monohydrogentartrate anions.

The substituents of the 2-amino-5-nitropyridinium cations are those which do not significantly change the favorable orientation of the polarizable organic entity in the crystalline network.

Left-handed or right-handed monohydrogentartrate crystals are well-known and are especially described in Chemische Krystallographie, P. Groth, vol. 3, page 302 et seq. (1910); Acta Cryst. (1966), 21,237–243 and Appl. Cryst. (1979), 12,537–544.

According to a preferred variant, in the crystalline structure the cation corresponds to the following formula:

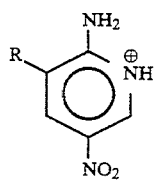

in which: R represents a hydrogen atom, a methyl or ethyl radical or a hydroxyl radical.

Again preferably, the cation is 2-amino-5-nitropyridinium.

Without being bound in any way whatsoever to a scientific theory, the Applicant nevertheless thinks that these structures have a specific cohesion due to short hydrogen bonds of the tartrate chains with each other, bonds which cannot be ruptured by the associated organic cations.

These crystals are found to possess the stability, transparency and ease of crystalline growth of the salts of tartaric acid.

Other crystals similar to the crystals obtained from the tartrate and having the same cohesion could also be envisaged without departing from the scope of the present invention.

The invention also relates to a process for the preparation of the crystalline structures such as have been described in the description above, wherein one mole of optionally substituted 2-amino-5-nitro-pyridine is mixed with at least one mole of left-handed and/or right-handed tartaric acid in a suitable solvent, especially water, wherein the mixture is crystallized with, in the case where the tartaric acid used is at least partly racemic (left-handed and right-handed), separation of the left-handed crystals from the right-handed crystals, and wherein the crystalline structures are recovered.

Preferably, one mole of optionally substituted 2-amino-5-nitropyridine will be mixed with at least two moles of left-handed or right-handed tartaric acid.

Crystallization is carried out under the same conditions as that used for tartaric acid itself. It is thus a method well known to one skilled in the art.

Advantageously, in a saturated solution of an anion/-cation mixture, in rotation, there will be present a crystalline seed of a crystalline structure such as described above. Slow evaporation leads to the desired crystallization, at constant temperature (especially ambient temperature). This temperature can also be progressively lowered.

In the case where racemic tartaric acid is used, successive crystallization leads to the desired left-handed or right-handed structures.

In the preferred case where optically active forms of tartaric acid are used, the production of left-handed or right-handed tartaric acid is well known to one skilled in the art and results from separation by successive crystallization of racemic tartaric acid.

It is indeed preferable to combine forms of tartaric acid separated beforehand with the organic molecule. By selecting the left-handed or right-handed form of the acid prior to the mixing, the necessity of separating the two left-handed and right-handed ionic crystals which would result from a racemic mixing is avoided.

The monocrystals have the required properties, that is to say a polar crystalline structure (P2$_1$ space group) compatible both with the demands of nonlinear optics (quadratic effects) and with ferroelectricity, a nonlinear response and a satisfactory transparency/efficiency compromise.

Moreover, they produce a virtually perfect stacking of organic dipoles parallel to the polar axis 2$_1$, in their structure, maximizing the values of the coefficients $r_{22}$ and $d_{22}$ of the electrooptical tensors and of second-harmonic generation, the crystalline polar axis being graded 2.

The invention relates to a device having an electro-optical effect containing a crystalline structure such as described above. These devices generate a second-harmonic or more generally a frequency sum or difference. The applications which flow from these advantageous properties are many, both as a bulk crystal and as a guiding structure, such as:

phase modulation of an optical carrier
amplitude modulation
directional waveguide coupler,
electrooptical crossover and more generally electrooptical switchover point,
electrooptical sampling,
electronic logic,
electrooptical triggering of lasers ("Q-Switch") without prejudice to applications demanding a phase harmony by birefringence, such as:
second-harmonic generation,
frequency conversions
parametric amplification, emission and oscillation.

By way of example, a laser cavity having electrooptical triggering equipped with a crystalline structure according to the invention is described below.

In such a device, a crystalline structure according to the invention is introduced into the cavity of a laser (for example a YAG laser emitting at 1.06 or 1.34 m and more generally any laser emitting in a transparency range of the crystal from 0.45 to 1.7 m) in a configuration of the Pockel's cell type. The combination of polarizations and reflections leads to blocking of the emission when the crystal is under voltage. In the absence of voltage, the crystal again becomes passing and the cavity can emit. A basic general diagram is, for example, shown in R. W. Hellwarth, "Q Modulation of Lasers" in Lasers, Vol. 1, edited by A. K. Levine (New York, Marcel Dekker, 1966), p. 253.

The invention is now illustrated by the embodiment examples given by way of indication:

EXAMPLE 1

One mole of 2-amino-5-nitropyridine is dissolved in a solution of left-handed tartaric acid (50 cm$^3$ H$_2$O) containing three moles of acid. Dissolution is rapid at 50° C.

The chemical reaction is written: $C_5H_5N_3O_2 + L—C_4H_6O_6$ $C_5H_6N_3O_2^+ + L—C_4H_5O_6^-$ $C_5H_6N_3O_2^+ \cdot L—C_4H_5O_6^-$

EXAMPLE 2

The reaction is carried out in the same way as in Example 1, left-handed tartaric acid being replaced by right-handed tartaric acid.

EXAMPLE 3

Racemic DL tartaric acid is mixed in the same way as in Example 1 with 2-amino-5-nitropyridine and leads to the separation of the left-handed and right-handed isomers.

In all cases, evaporation of the solutions at ambient temperature produces beautiful crystals of left-handed or right-handed monohydrogentartrates of 2-amino-5-nitropyridinium which can be confused with crystals of left-handed (or right-handed) tartaric acid, both having the same morphology, those of the left-handed or right-handed salts of P2$_1$ symmetry of tartaric acids.

Squat crystals of 5 mm × 5 mm × 8 mm were easily obtained. All these crystals are pale yellow, which distinguishes them from the left-handed or right-handed tartaric acids.

DESCRIPTION OF THE DRAWINGS

The appended FIGS. 1 and 2 illustrate, for the crystals obtained according to Example 1, the perfect alignment of the molecular dipoles ranging from the nitro group to the amino group, along the crystallographic axis b, axis b is the binary symmetry axis of the space group $P2_1$. The direction of the organic dipoles corresponds to the maximization of the coefficients $d_{22}$ (second-harmonic effects and parametric effects) and $r_{22}$ (electrooptical effects).

Figure 1:
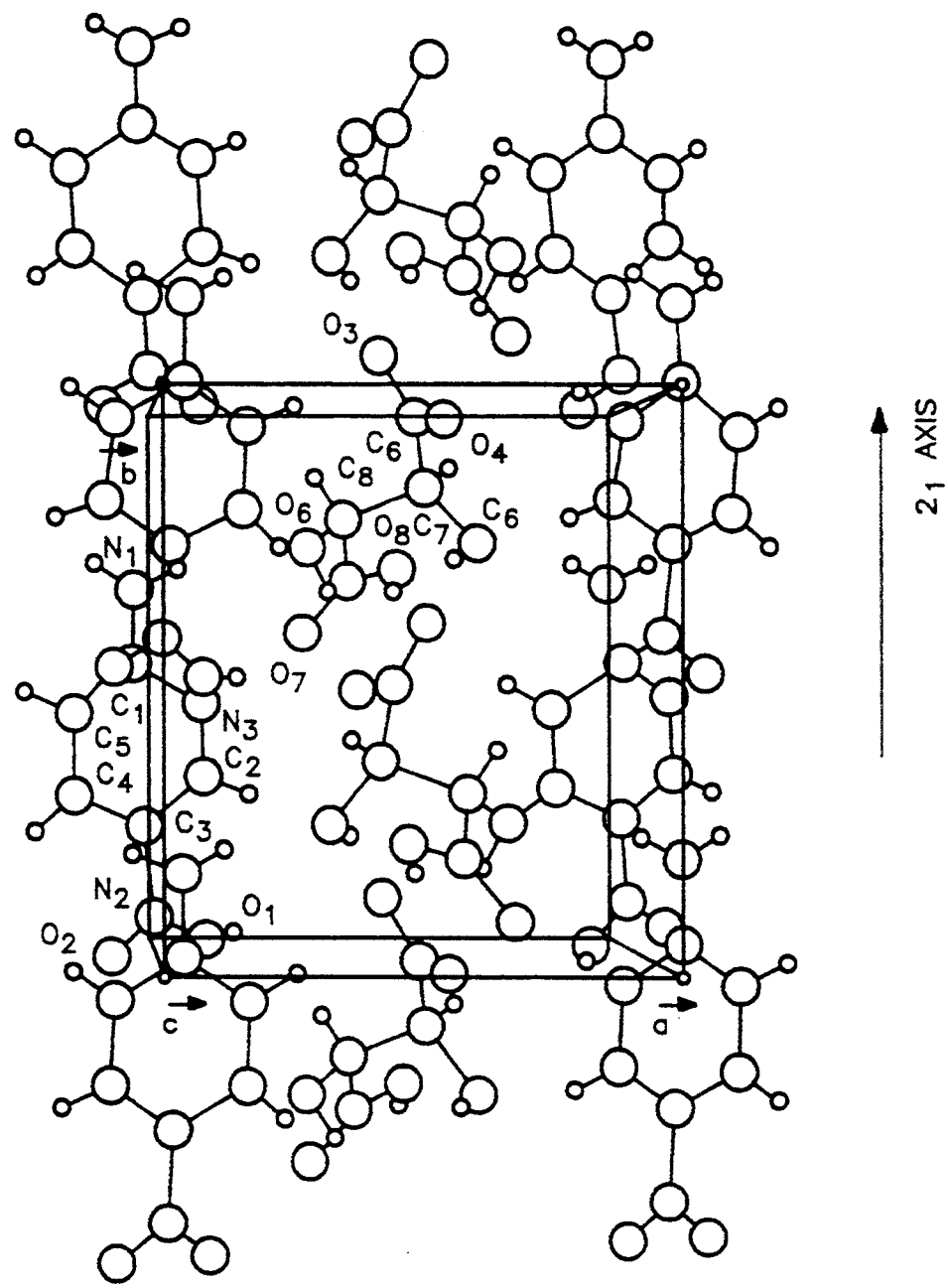

We claim:

1. A crystalline structure exhibiting nonlinear quadratic effects and a wide transparency range extending from the visible to the near infrared, consisting of 2-amino-5-nitropyridinium cations combined with polyanionic organic matrix of left-handed or right-handed monohydrogentartrate anions; wherein the cation corresponds to the following formula:

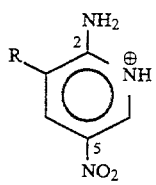

in which:
R represents a hydrogen atom, a methyl or ethyl radical or a hydroxyl radical.

2. The crystalline structure as claimed in claim 1, wherein the cation is 2-amino-5-nitropyridinium.

* * * * *